(12) United States Patent
Kim

(10) Patent No.: US 8,114,557 B2
(45) Date of Patent: Feb. 14, 2012

(54) METHOD FOR OPTICAL PROXIMITY CORRECTION

(75) Inventor: Cheol Kyun Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 136 days.

(21) Appl. No.: 12/639,203

(22) Filed: Dec. 16, 2009

(65) Prior Publication Data

US 2010/0248089 A1    Sep. 30, 2010

(30) Foreign Application Priority Data

Mar. 27, 2009    (KR) .................. 10-2009-0026394

(51) Int. Cl.
*G03F 1/00* (2006.01)
*G06F 17/50* (2006.01)

(52) U.S. Cl. .............................. 430/5; 716/53

(58) Field of Classification Search ......... 430/5; 716/53
See application file for complete search history.

(56) References Cited

U.S. PATENT DOCUMENTS

| | | | |
|---|---|---|---|
| 6,226,781 B1 * | 5/2001 | Nistler et al. ................ | 716/53 |
| 2008/0295059 A1 * | 11/2008 | Choi ............................. | 716/53 |
| 2010/0017779 A1 * | 1/2010 | Kim ............................. | 716/55 |

* cited by examiner

*Primary Examiner* — Mark F Huff
*Assistant Examiner* — John S Ruggles
(74) *Attorney, Agent, or Firm* — Ladas & Parry LLP

(57) ABSTRACT

Provided is a method for optical proximity correction for use in manufacturing highly resolved semiconductor chips. The method includes setting a target layout; setting a peculiar area; sorting the peculiar area from the target layout; generating a marking layer; resetting a critical dimension (CD) of a peculiar pattern; compensating an optical proximity effect; and manufacturing a mask. The method provides an improved way of improving more accurately CD uniformity by performing optical proximity correction with respect to a pattern to which a bias rule is difficult to apply due to an absence of an adjacent pattern.

11 Claims, 6 Drawing Sheets

METHOD FOR OPTICAL PROXIMITY CORRECTION

CROSS-REFERENCES TO RELATED APPLICATIONS

The present application claims priority to Korean patent application number 10-2009-0026394, filed on Mar. 27, 2009, which is incorporated by reference in its entirety.

BACKGROUND OF THE INVENTION

1. Field of the Invention

The present invention relates to an optical proximity correction method, and more particularly, to an optical proximity correction method for making a contact hole pattern to which a bias rule is difficult to apply.

2. Description of the Related Art

As the demands for increasing the integration density of semiconductor devices has continued, the design rules impose physical restraints on the methods of forming these ever refined patterns. To achieve this end of producing ever smaller patterns, shorter wavelength from exposure sources have been exploited. However, these sources and shorter wavelengths do cause a number of difficulties in patterning in accordance to a design layout feature. As a result the pattern printed out on the resultant wafer may become unacceptably distorted from the originally intended pattern. As the patterns becomes finer, the light intensity likely increase to achieve the particular pattern which can adversely affect adjacent patterns due to the optical proximity effect where the pattern formed over the wafer has a different shape from a pattern of the layout on the design.

The optical proximity effect needs to be compensated because it can contribute to degrading the performance of the resultant semiconductor devices. An optical proximity correction refers to a technique used to correct or to compensate for the layout to be formed over the wafer. The optical proximity correction includes a rule-based optical proximity correction for correcting the layout based on rules of mask layout correction, and a model-based optical proximity correction for correcting a mask layout by predicting an image transcribed over the wafer based on mask pattern information and a wafer process condition. Particularly, in the model-based optical proximity correction, the optical proximity correction is performed by applying an etching model that uses a critical dimension (CD) data of a final pattern formed by an etching process in which a photoresist pattern is used as an etch mask. Thus, the optical proximity correction for the semiconductor device implemented with an actual final pattern provides an improved accuracy in the resultant final pattern.

Meanwhile, in a case of forming a contact hole pattern among various kinds of other patterns of the semiconductor device, pattern uniformity has a significant effect on the performance of a highly integrated semiconductor device. Therefore optical proximity correction for correcting the contact hole pattern is especially important and hence emphasized. However, the contact hole pattern has a higher mask error enhancement factor so that there is a higher probability that an error can occur when only using the more conventional optical proximity correction methods. Also, a final CD after the etching process can induce a variation in CD due to the density of patterns that exist in the vicinity of a targeted pattern. Therefore, when applying the above described model-based optical proximity correction method to the contact hole pattern, it is very difficult to perform a sufficiently accurate correction since the final CD of the contact hole pattern is changed.

FIG. 1a illustrates a contact hole pattern to which a bias rule is applicable according to the related art and FIG. 1b illustrates a contact hole pattern to which the bias rule is not applicable according to the related art.

As shown in FIG. 1a, a bias rule R for obtaining a CD (W) data of a final pattern 10 applies only in a case when there is an object pattern and a pattern adjacent thereto. In other words, based on a space S between two adjacent final patterns 10, the bias rule R can be determined to meet a final inspection critical dimension (FICD) of the final pattern. Therefore, the bias rule R determined as described above can be used to perform a more accurate optical proximity correction that uses the FICD of the final pattern.

However, as shown in FIG. 1b, when patterns 10' are to be implemented are not adjacent and thus are not arranged in a straight row, it is difficult to apply the bias rule. Therefore, the FICD of the final pattern has a lower uniformity so that the etching model becomes inaccurate. Thus, the accuracy of the optical proximity correction of the conventional methods that using the etching model is degraded.

BRIEF SUMMARY OF THE INVENTION

Embodiments of the present invention are directed to an accurate optical proximity correction in a case where it is difficult to apply a bias rule due to an absence of an adjacent pattern.

According to an embodiment of the present invention, a method for optical proximity correction includes setting a target layout; setting a peculiar area from within the target layout; sorting the peculiar area from within the target layout; generating a marking layer; resetting a critical dimension (CD) of a peculiar pattern; compensating for an optical proximity effect; and manufacturing a mask.

Preferably, the setting the peculiar area includes setting as the peculiar area an area that has a part of patterns of the target layout, a distance between the part of the patterns in the area being not measurable.

Preferably, the setting the peculiar area includes setting as the peculiar area from within the target layout an area of a full chip pattern, which is formed by using an exposure mask in which an optical proximity correction is performed with respect to the target layout and, when compared to a pattern of the target layout, is not identical with the pattern of the target layout. Thus, by setting as the peculiar area an area having patterns of which space therebetween is not measurable to render it difficult to apply a bias rule, the optical proximity correction can be performed on such area.

Preferably, the sorting the peculiar area is performed by an XOR logic operation.

Preferably, the sorting the peculiar area includes sorting a layout corresponding to a layout of the peculiar area that is evenly symmetrically displaced.

Preferably, the sorting the peculiar area includes sorting a layout corresponding to a layout of the peculiar area that is rotationally displaced.

Preferably, the generating the marking layer includes extracting a CD of the peculiar pattern and a CD of a target pattern; marking a portion that is different from between the CD of the target pattern and the CD of the peculiar pattern; and separating the marked portion to generate a new layer.

Preferably, the resetting the CD of the peculiar pattern includes measuring a distribution of a delta CD for each of the peculiar area; setting an offset using the delta CD; and reflecting the offset in the CD of a target pattern.

Preferably, the delta CD is a difference between the CD of the target pattern and the CD of the peculiar pattern.

Preferably, the offset is a difference between the delta CD that shows a highest distribution in a first peculiar area and the delta CD that shows a highest distribution in a second peculiar area.

Preferably, the reflecting the offset includes adding or subtracting the offset to or from the CD of the peculiar pattern.

According to the present invention, in case of a pattern to which a bias rule is difficult to apply because there is no adjacent pattern thereto, a CD uniformity of a final pattern can be improved so that an optical proximity correction is performed more accurately.

DESCRIPTION OF EMBODIMENTS

The present invention relates to an optical proximity correction method in which an optical proximity correction is performed by sorting a peculiar area from a target layout and resetting a critical dimension (CD) of a design pattern based on the sorted layout so that, in case where a pattern, such as a contact hole pattern that does not have any pattern adjacent thereto to render it difficult to apply a bias rule, the bias rule can be reflected by performing optical proximity correction, thereby improving the accuracy of the optical proximity correction. Therefore, a uniformity of a final pattern can be secured. Hereinafter, the example embodiments of the present invention will be described in detail with reference to the accompanying drawings.

Figure 1A:
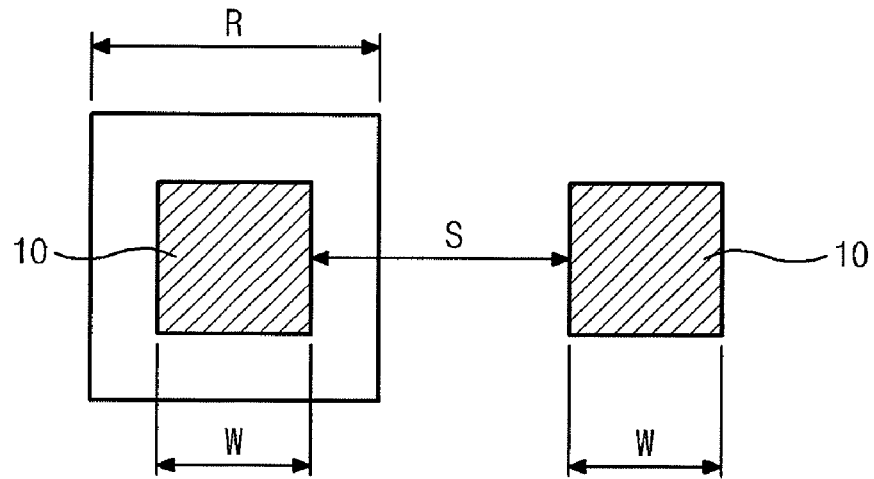
FIG. 1a illustrates a contact hole pattern to which a bias rule is applicable according to the related art.
Figure 1B:
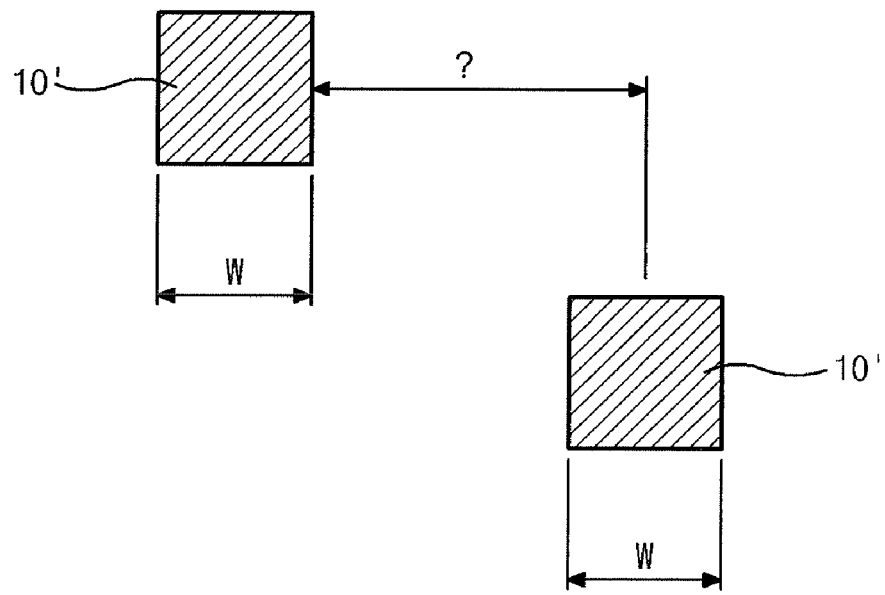
FIG. 1b illustrates a contact hole pattern to which a bias rule is not applicable according to the related art.
Figure 2:
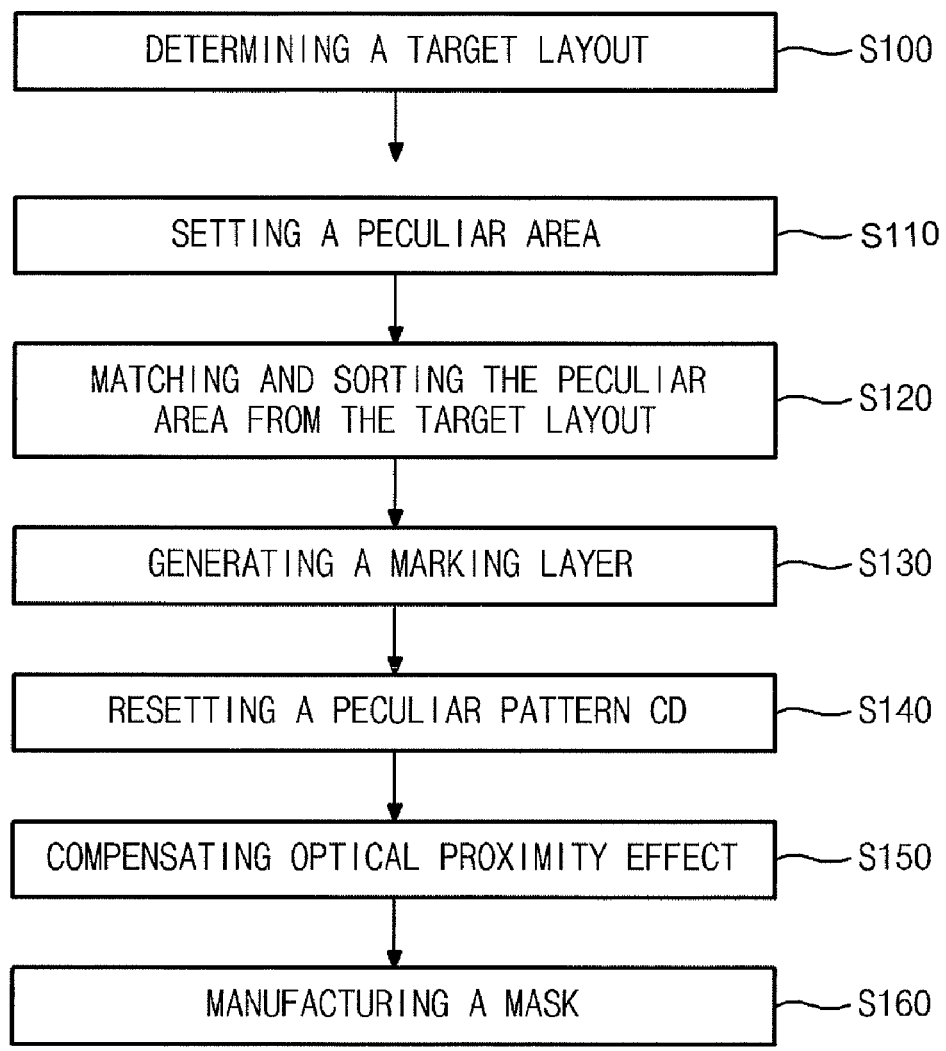
FIG. 2 is a flowchart illustrating an optical proximity correction method according to an example embodiment of the present invention.
Figure 3A:
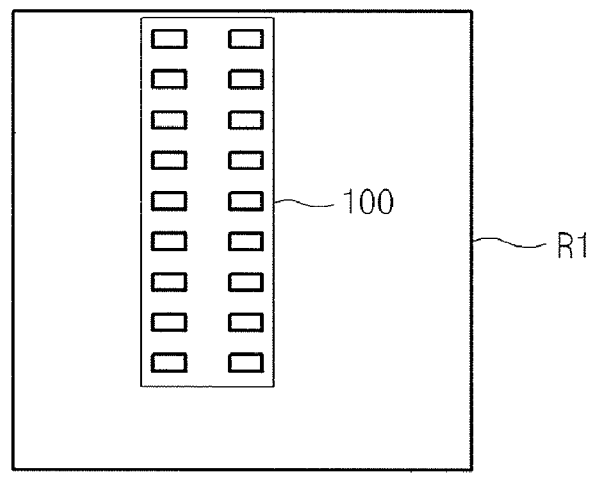
FIGS. 3a through 3c illustrate a peculiar area according to an example embodiment of a present invention.
Figure 3B:
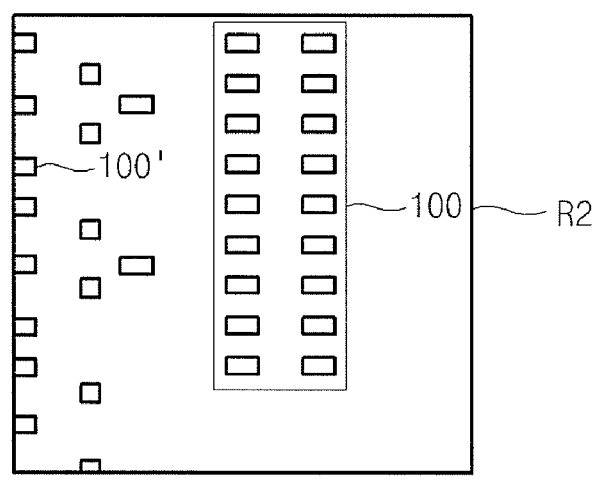
Figure 3C:
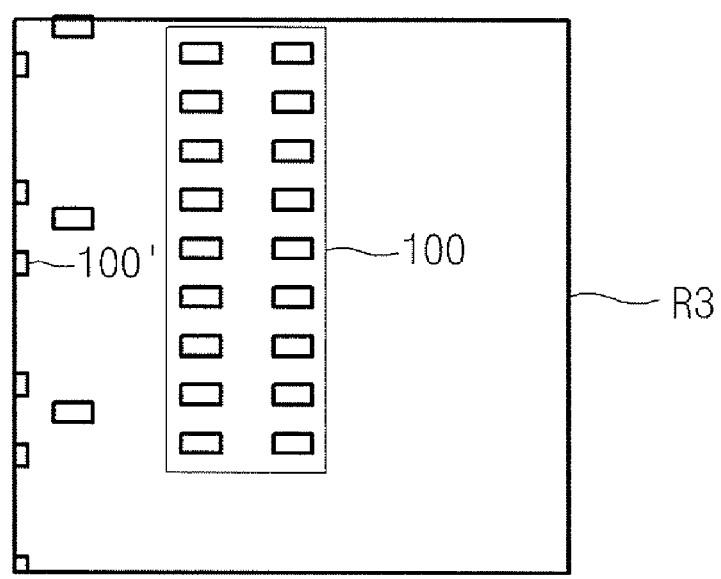
Figure 4A:
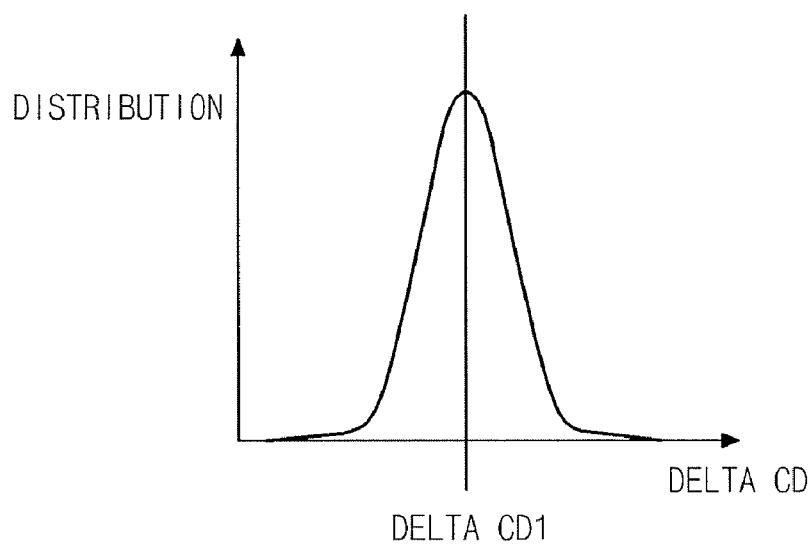
FIGS. 4a through 4c are graphs showing a delta-CD distribution of a peculiar area according to an example embodiment of a present invention.
Figure 4B:
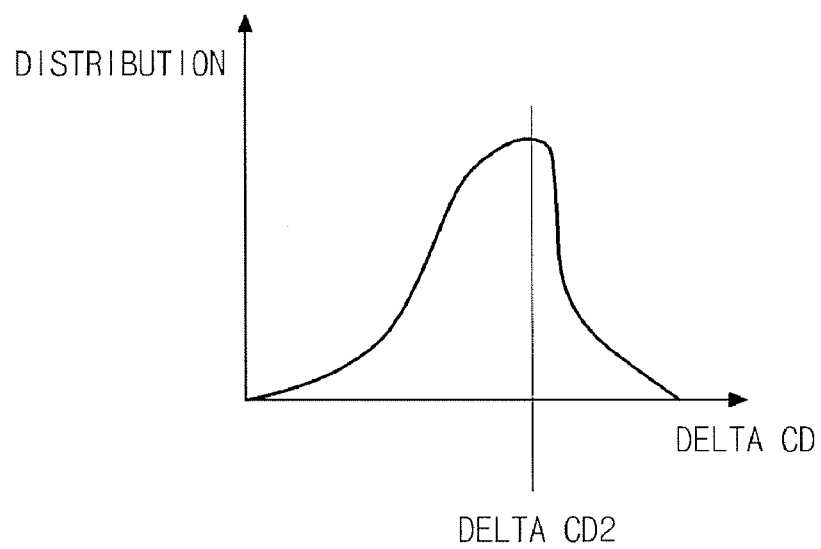

FIG. 2 is a flowchart illustrating an optical proximity correction method according to an exemplary embodiment of the present invention. FIGS. 3a through 3c illustrate a peculiar area according to an exemplary embodiment of a present invention. FIGS. 4a and 4b are graphs showing a delta-CD distribution of the peculiar area according to an exemplary embodiment of a present invention.

As illustrated in FIG. 2, in the optical proximity correction method, a target layout to be finally implemented is designed in step S100.

Next, a peculiar area is determined in step S110. Here, the peculiar area refers to an area of a pattern (hereinafter, referred to as a full chip pattern), which is formed by using an exposure mask in which an optical proximity correction is performed with respect to the target layout and, when compared to a pattern of the target layout, is not identical with the pattern of the target layout. Specifically, the peculiar area refers to an area having a pattern to which a bias rule is difficult to apply due to a difficulty in defining a space between adjacent contact hole patterns so that a difference exists between the target layout and the full chip pattern.

Hereinafter, a pattern formed within the peculiar area is referred to as a 'peculiar pattern.' When there is no pattern in the vicinity of the peculiar pattern or a different pattern is formed in the vicinity of the peculiar pattern, patterning of the peculiar pattern is affected so that the peculiar pattern has a distorted pattern. Example embodiments of the present invention will be described in more detail with reference to FIG. 3a through 3c.

For example, as shown in FIGS. 3a through 3c, the peculiar area can largely be divided into a peculiar area R1 of a target layout where there is no pattern in the vicinity of a peculiar pattern 100 and peculiar areas R2 and R3 where different patterns 100' is formed in the vicinity of the peculiar pattern 100. Other than the peculiar areas R1, R2 and R3, it should be noted that the peculiar area can include an area in which a pattern having a different pattern density is formed near the peculiar pattern 100. Preferably, the peculiar areas R1, R2 and R3 respectively have a width W and a length L, each of which corresponds to approximately 1 µm to 5 µm. In this manner, it may facilitate the calculation of the pattern density that affects patterning of the peculiar pattern 100.

Next, in step S120, the peculiar area is matched to the target layout to identify an area in the target layout that corresponds to the peculiar area. Namely, a target pattern is sorted out from the target layout. Here, the target pattern is a pattern that is formed on an area that corresponds to the peculiar area in the target layout. More specifically, the above step can be performed by using an XOR logic operation. That is, the above step can be performed by sorting not only an area having a layout identical with a layout of the peculiar area but also sorting an area having a layout corresponding to the layout of the peculiar area that is symmetrically displaced or rotationally displaced. Therefore, the target pattern preferably includes a pattern formed within the peculiar area that is symmetrically displaced or rotationally displaced as well as a pattern formed within the peculiar area.

Next, a marking layer is produced in step S130. Generating the marking layer includes extracting a critical dimension (CD) of a target pattern and extracting a critical dimension of a peculiar pattern, marking a portion that is different between the target pattern CD and the peculiar pattern CD, and separating the marked portion to generate a new layer. The reason for generating the new layer by separating the marked portion is because it facilitates the identification of a distribution of a CD difference by matching the target pattern and the peculiar pattern to easily extract the CD difference between the target pattern CD and the peculiar pattern CD.

Next, the peculiar pattern CD is reset in step S140. The reason for resetting the peculiar pattern CD is to adjust the peculiar pattern CD within the full chip pattern to have the target pattern CD. The step to reset the peculiar pattern CD includes a step to set an offset of the peculiar pattern with respect to the target pattern CD and the step to add or subtract the offset to or from the peculiar pattern CD, such that the peculiar pattern CD, has an identical value with the target pattern CD. The offset of the peculiar pattern can be calculated by using a delta CD distribution of the peculiar pattern (refer to FIGS. 4a through 4c)

Figure 4C:
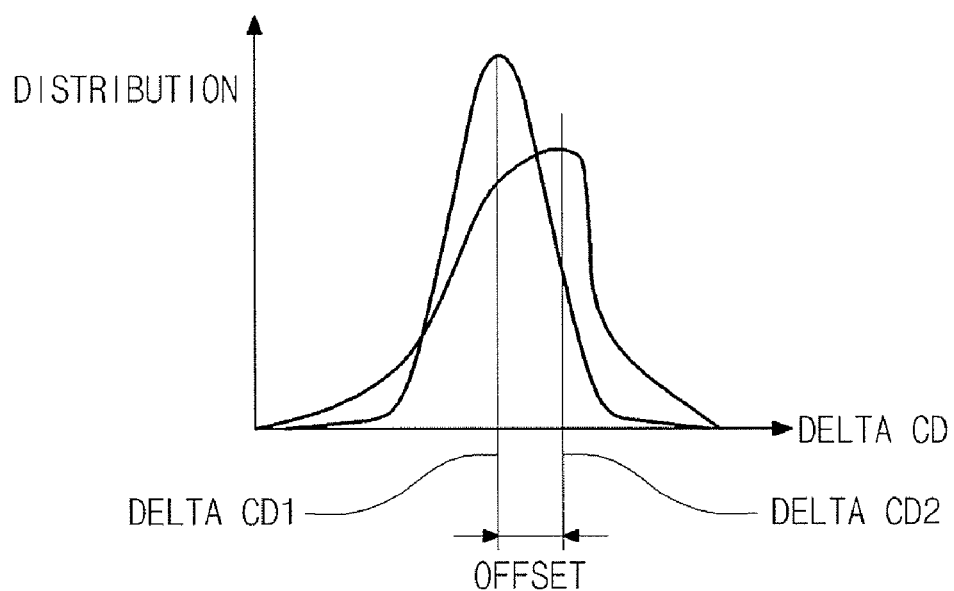

In graphs shown in FIGS. 4a through 4c, an X-axis represents a delta CD and a Y-axis represents the distribution of the delta CD. Thus, the distribution of the peculiar pattern in the peculiar area that deviates from the target pattern is shown in the graphs in FIGS. 4a through 4c. Here, the delta CD indicates a difference between the target pattern CD and the peculiar pattern CD. For example, as shown in FIG. 4a, a first delta CD1 is the difference between the target pattern CD and the peculiar pattern CD that shows the highest distribution in a first peculiar area. As shown in FIG. 4b, a second delta CD2 is the difference between the target pattern CD and the peculiar pattern CD that shows the highest distribution in a second peculiar area. In FIG. 4c, the offset of the peculiar pattern becomes a difference between the first delta CD1 and the second delta CD2. In other words, the offset is obtained by, first determining the difference between the target pattern CD and the peculiar pattern CD for each peculiar area and, second determining the difference between delta CDs for respective peculiar areas.

Next, an optical proximity correction is performed in step S150. Here, a step to perform the optical proximity correction, which is aimed to implement the target layout on the wafer, can be identical with the related art. Namely, a calibration is performed on a pattern that is distorted from the target layout to be implemented on the wafer, and simulation modeling is performed such that the final pattern has an image that approximates to the target layout. The calibration process can be understood as a process of reducing or minimizing the difference between the target layout and the distorted pattern by using methods of adding or removing patterns that has a resolution equal to or less than that of an exposure mask pattern. For example, line-end treatment or insertion of scattering bars can be used. The line-end treatment may include adding a corner serif pattern or a hammer pattern in order to overcome the rounding of an end portion of a line pattern. The insertion of scattering bars may include adding sub-resolution scattering bars to reduce or minimize variation in pitches on the patterns with respect to a pattern density.

Next, a mask is manufactured in step S160. Here, the mask manufactured according to the present invention has a mask pattern formed thereon by performing the optical proximity correction on the contact hole patterns where, according to the conventional optical proximity correction method, the bias rule is not applicable.

According to the optical proximity correction method of the present invention comprising the above described steps, the optical proximity correction can be performed more accurately on the contact hole patterns for which the bias rule is difficult to apply so that patterns formed over a wafer has an improved uniformity, thereby reducing a defect ratio of semiconductor devices.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for optical proximity correction, the method comprising:
   setting a target layout;
   setting a peculiar area from within the target layout;
   sorting the peculiar area from within the target layout;
   generating a marking layer;
   resetting a critical dimension (CD) of a peculiar pattern;
   compensating for an optical proximity effect; and
   manufacturing a mask.

2. The method according to claim 1, wherein the setting the peculiar area includes setting as the peculiar area an area that has a part of patterns of the target layout, a distance between the part of the patterns in the area being not measurable.

3. The method according to claim 1, wherein the setting the peculiar area includes setting as the peculiar area an area of a full chip pattern, which is formed by using an exposure mask in which the optical proximity correction is performed with respect to the target layout and, when compared to a pattern of the target layout, is not identical with the pattern of the target layout.

4. The method according to claim 1, wherein the sorting the peculiar area is performed by an XOR logic operation.

5. The method according to claim 1, wherein the sorting the peculiar area includes sorting a layout corresponding to a layout of the peculiar area that is evenly symmetrically displaced.

6. The method according to claim 1, wherein the sorting the peculiar area includes sorting a layout corresponding to a layout of the peculiar area that is rotationally displaced.

7. The method according to claim 3, wherein the generating the marking layer comprises:
   extracting a CD of the peculiar pattern and a CD of a target pattern;
   marking a portion that is different from the CD of the target pattern and the CD of the peculiar pattern; and
   separating the marked portion to generate a new layer.

8. The method according to claim 3, wherein resetting the CD of the peculiar pattern comprises:
   measuring a distribution of a delta CD for each of the peculiar area;
   setting an offset using the delta CD; and
   reflecting the offset in the CD of a target pattern.

9. The method according to claim 8, wherein the delta CD is a difference between the CD of the target pattern and the CD of the peculiar pattern.

10. The method according to claim 8, wherein the offset is a difference between the delta CD that shows a highest distribution in a first peculiar area and the delta CD that shows a highest distribution in a second peculiar area.

11. The method according to claim 8, wherein the reflecting the offset includes adding or subtracting the offset to or from the CD of the peculiar pattern.

* * * * *